(12) United States Patent
Pitsch et al.

(10) Patent No.: US 6,442,255 B1
(45) Date of Patent: Aug. 27, 2002

(54) AUTOMATIC SUBSCRIBER CALLBACK SYSTEM

(75) Inventors: Robert Alan Pitsch, Carmel; Suresh Vishwanath Leley, Indianapolis; Michael Gene Kelly, Fishers, all of IN (US)

(73) Assignee: Thomson Licensing S.A., Boulogne (FR)

( * ) Notice: Subject to any disclaimer, the term of this patent is extended or adjusted under 35 U.S.C. 154(b) by 0 days.

(21) Appl. No.: 09/091,335

(22) PCT Filed: Dec. 17, 1996

(86) PCT No.: PCT/US96/20514
§ 371 (c)(1),
(2), (4) Date: Jun. 16, 1998

(87) PCT Pub. No.: WO97/23989
PCT Pub. Date: Jul. 3, 1997

Related U.S. Application Data
(60) Provisional application No. 60/009,178, filed on Dec. 22, 1995.

(30) Foreign Application Priority Data

| Jan. 2, 1996 | (GB) | ................................................ 9600002 |
| Jun. 28, 1996 | (GB) | ................................................ 9613608 |

(51) Int. Cl.⁷ ............................................. H04M 11/00
(52) U.S. Cl. ............................. 379/106.01; 379/93.12; 379/102.03; 725/109
(58) Field of Search ................ 379/37, 39, 40, 379/42–44, 46, 47, 92.01, 92.04, 93.01, 93.05, 93.08, 93.12, 102.01–102.07, 106.01–106.08, 201, 355, 377, 394, 201.01, 355.01–355.03; 725/109–111

(56) References Cited

U.S. PATENT DOCUMENTS

| 4,132,864 | A | | 1/1979 | Feng |
| 4,431,867 | A | * | 2/1984 | Heatherington .......... 379/93.28 |
| 4,847,896 | A | | 7/1989 | Siligoni et al. |
| 5,239,575 | A | * | 8/1993 | White et al. ........... 379/106.06 |
| 5,241,565 | A | | 8/1993 | Kloc et al. |
| 5,394,465 | A | * | 2/1995 | Jo .............................. 379/377 |
| 5,488,654 | A | * | 1/1996 | Oliver ................... 379/106.08 |
| 5,494,573 | A | * | 2/1996 | Schoenmeyr et al. ......... 210/94 |
| 5,727,248 | A | * | 3/1998 | Ogura ............................ 399/8 |
| 6,064,724 | A | * | 5/2000 | Kelly ...................... 379/92.04 |
| 6,134,321 | A | * | 10/2000 | Pitsch ........................ 379/399 |

FOREIGN PATENT DOCUMENTS

EP    527072    2/1993

* cited by examiner

*Primary Examiner*—Fan Tsang
*Assistant Examiner*—Roland G. Foster
(74) *Attorney, Agent, or Firm*—Joseph S. Tripoli; Robert D. Shedd

(57) ABSTRACT

A subscriber callback modem, includes a source of callback data. A modem is coupled to a subscriber telephone line, and a control circuit is coupled between the data source and the modem, for conditioning the modem to automatically call a central computer and transfer the callback data from the data source to the central computer.

14 Claims, 7 Drawing Sheets

AUTOMATIC SUBSCRIBER CALLBACK SYSTEM

The present patent application claims priority of PCT application PCT/US96/20514 filed on Dec. 17, 1996 and provisional U.S. patent application Ser. No. 60/009178 filed on Dec. 22, 1995.

FIELD OF THE INVENTION

The present invention relates to a system in a remote location which is capable of operating totally automatically to call to a central computer under varying operating conditions, and transfer callback data from the remote location to the central computer.

BACKGROUND OF THE INVENTION

Current programming distribution systems for television and interactive television programming include provisions or distribution of pay-per-view programs. Ensuring that subscribers can order and are charged properly for viewing pay-per-view programs is a problem in such systems. This problem has two aspects. First, it should be easy for a subscriber to order a pay-per-view program, and second the subscriber must be properly charged when a pay-per-view program is ordered and viewed.

In a cable distribution system, the subscribers are in a restricted geographical location around the cable head end, and there are a relatively low number of subscribers to that head end, e.g. generally one town. In such systems, to order a pay-per-view program the subscriber calls the cable provider on the telephone and speaks to a cable provider employee. This employee, then arranges to have proper codes sent via the cable connection to that subscriber's cable box to descramble the pay-per-view program that was ordered, and revert to scrambling that channel when the program is over. The fee for viewing that pay-per-view is added to the subscriber bill at the same time. Because of the geographical proximity and relatively low number of subscribers, the telephone order system is a workable solution in such systems.

However, in a satellite distribution system, the subscriber locations are disbursed over a very wide geographical area, e.g. an entire continent, and there are several orders of magnitude more customers in a satellite distribution system than in any single cable head end. Thus, a phone order system in not practical in a satellite distribution system. It has been proposed, therefore, that the satellite receiver at each subscriber location maintain in a memory a record of any pay-per-view programs viewed by the subscriber. The record of such programs, is reported to a central location via a telephone/modem link, a process termed callback.

Telephone/modem links between cooperating computers are very well known. However, in the case of a satellite receiver, the callback modem will not be a part of a computer system under control of a computer operator. Instead, the callback modem must operate totally automatically. Several problems exist when a telephone modem is used to call back information without operator control and/or intervention. Because a callback can occur automatically at a predetermined time, without any knowledge of what the subscriber is doing, the callback mechanism needs to ensure that such a callback can occur without interfering with what the subscriber is doing, and without causing interference with or degradation of the subscriber's phone operation. This, in turn, has several aspects. First, the callback modem must release the telephone line whenever the subscriber wants access to the phone.

Second, the callback modem must be able to operate automatically with telephone central offices which may have abnormal interface behaviors. Some of the abnormal interfaces presented by central offices include: very short dial tones; pulse dial only; distorted dial tones; 60 Hz modulation on the dial tone; no dial tone; fast busy return tone; long delay before dial tone; fluctuation telephone line current during telephone access; and/or fluctuating current between off hook operation.

Third, the callback modem must be able to transfer the subscriber data through unknown distortions introduced by the telephone line connections between the callback modem and the central computer. Some distortions may be compensated by utilizing an adaptive equalizer, in a known manner. However, in some cases, the dynamic conditions of the telephone line, line loss conditions at the called modem location, and distortions presented. by the modem coupling transformer are not correctable using an adaptive equalizer.

EP 0 527 072 A2 issued to White et al. discloses a telephone dial-inbound data acquisition system with demand reading capability and U.S. Pat. No. 4,132,864 issued to Joseph S. Feng discloses a device for detecting a telephone off-hook situation.

The above mentioned problems must be addressed and overcome in a desired callback modem adapter for totally automatic operation.

BRIEF DESCRIPTION OF THE INVENTION

In accordance with principles of the present invention, a subscriber callback modem includes a source of callback data. A modem is coupled to a subscriber telephone line, and a control circuit is coupled between the data source and the modem, for conditioning the modem to automatically call a central computer and transfer the callback data from the data source to the central computer

DETAILED DESCRIPTION

In the illustrated embodiment, a callback modern is controlled using standard modem control codes, such as the codes originally proposed by Hayes Company. One skilled in the art will understand that any modem which may be controlled by, and which provides status signals to, a microcomputer may be used in the present invention.

Figure 1:
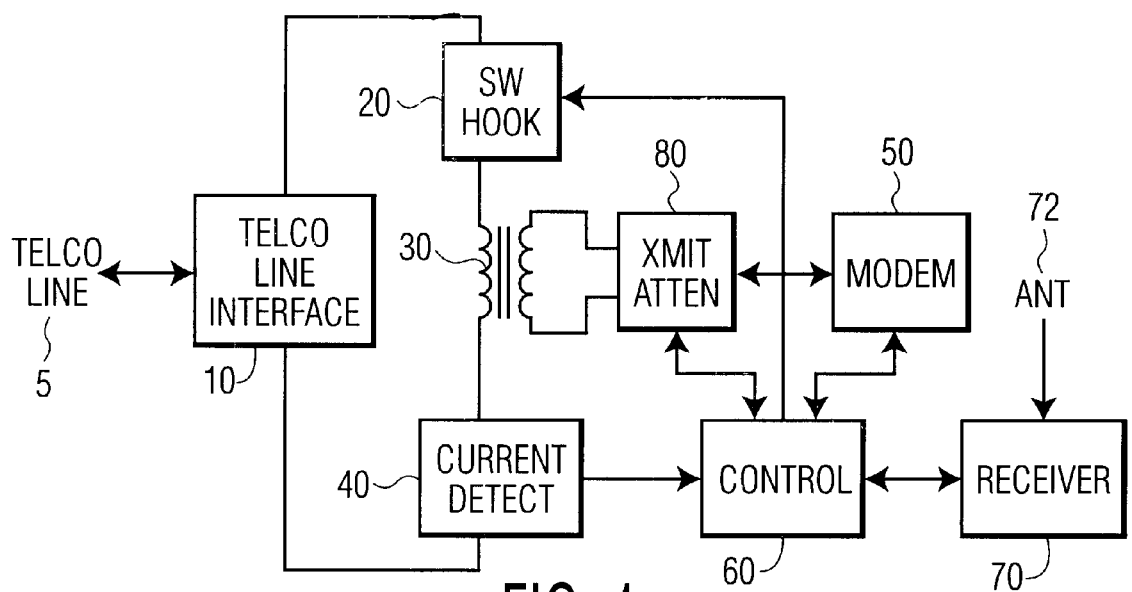
FIG. 1 is a block diagram of a callback modem incorporating the present invention.

FIG. 1 is a block diagram of a callback modem incorporating the present invention. In FIG. 1 an input terminal 5 is coupled to a subscriber telephone company (TELCO) line. The input terminal may include, for example, a standard RJ11 connector. The input terminal 5 is bidirectionally coupled to a terminal of a telephone company (TELCO) line interface circuit 10. The telephone company line interface circuit 10 includes isolation and protection circuitry which protects the remainder of the illustrated circuitry from electromagnetic interference (EMI), electrostatic discharge (ESD), lightning strikes, and so forth. The serial connection of a switch hook 20, one winding of a modem transformer 30 and a current detection circuit 40 is coupled between respective loop terminals of the telephone company line interface circuit 10.

A second winding of the modem transformer 30 is coupled to bidirectional data terminals of the modem 50 through a controllable transmit attenuator 80, which operates on outgoing modem 50 data only. An output terminal of the current detection circuit 40 is coupled to an input terminal of a control circuit 60. A first control output terminal of the control circuit 60 is coupled to a control input terminal of the switch hook 20, a second control output terminal of the control circuit 60 is coupled to a control input terminal of the controllable transmit. attenuator 80, an d a bidirectional control terminal of the control circuitry 60 is coupled to a corresponding control terminal of the modem 50. A bidirectional data terminal of the control circuit 60 is coupled to a corresponding data terminal of the satellite receiver 70, which receives data from a satellite antenna 72.

The control circuit 60, which may, for example, include a processor, controls the operation of the callback modem illustrated in FIG. 1. The operation of the modem illustrated in FIG. 1 may be better understood with reference to FIGS. 2 through 9. In general, when it is desired to connect the modem 50 to the telephone company line (e.g. at a predetermined time of day), the control circuit 60 supplies a control signal to the switch hook which conditions the switch hook 20 to become conductive, termed going off-hook. This enables loop current to flow through the switch hook 20, transformer 30 and current detection circuitry 40. The control circuit 60 then sends control signals to and receives status signals from the modem 50, and receives a signal from the current detector 40 indicating the level of current flowing though it. The control signal then conditions the modem 50 to connect to the remote computer. When the modem is connected to the remote computer, the control circuit 60 receives data from the satellite receiver circuitry 70 to communicate the pay-per-view (or any other such information) to the central computer. The control circuit 60 partitions this data into packets, and supplied these packets to the modem for transmission to the remote computer. When the information transfer is completed, the control circuit 60 conditions the modem to terminate the connection to the remote computer, then conditions the switch hook to become non-conductive, termed going on-hook.

Figure 2:
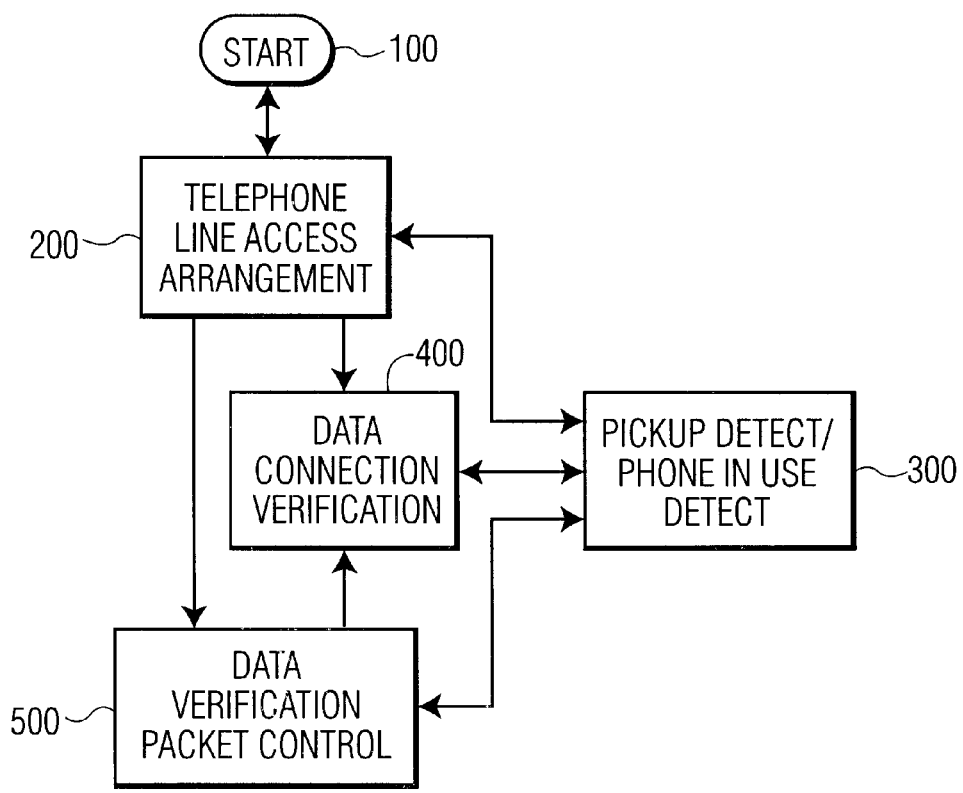
FIG. 2 is a block diagram illustrating the procedures performed by the control circuit of the callback modem illustrated in FIG. 1 when making a call back.

More specifically, referring to FIG. 2, the callback modem begins operation at block 100. When the callback modem desires to make the call back to the central computer, block 200 is entered in which the telephone call is made. A test is made to determine whether the subscriber line is in use (i.e. the subscriber is using the telephone) in block 300. If it is in use, the control circuit 60 supplies control signals to the switch hook 20 which conditions it to become non-conductive, termed going on-hook, and the call is tried again later. If on the other hand, the telephone is not in use, then the control circuit 60 supplies control signals to the modem 50 which conditions it to dial the telephone number of the remote computer.

Once the telephone number of the remote computer is dialed in block 300, the control circuit 60 supplies a control signal to the modem 50 conditioning it to attempt to establish a data connection to the central computer in block 400. Status signals from the modem 50 are analyzed by the control circuit 60 to determine whether a connection has been established. If not, various connection parameters are varied, in a manner to be described in more detail below, in an attempt to establish a connection.

When a connection has been established in block 403, data transfer is initiated between the callback modem and the remote computer in block 500. Data from the receiver 70 is supplied to the modem 50, which, under the control of the control circuit 60 partitions the data into packets which are transmitted to the central computer separately. The remote computer, when it receives a packet sends an acknowledgment packet back to the callback modem, acknowledging accurate reception of the packet. When the acknowledgment is received by the callback modem, the next data packet is sent to the central computer, and so forth. Data transfer from the central computer to the callback modem is performed in the same manner. During the data transfer in block 500, the connection is monitored in block 400 to ensure it is maintained. In addition, during all phases of the call, the subscriber telephone line is monitored in block 300 to detect if the subscriber has picked up the telephone during the data call. If the subscriber picks up the telephone at any time during the data call, the callback modem immediately releases the telephone line, and will attempt to reestablish the connection at a later time.

Figure 3:
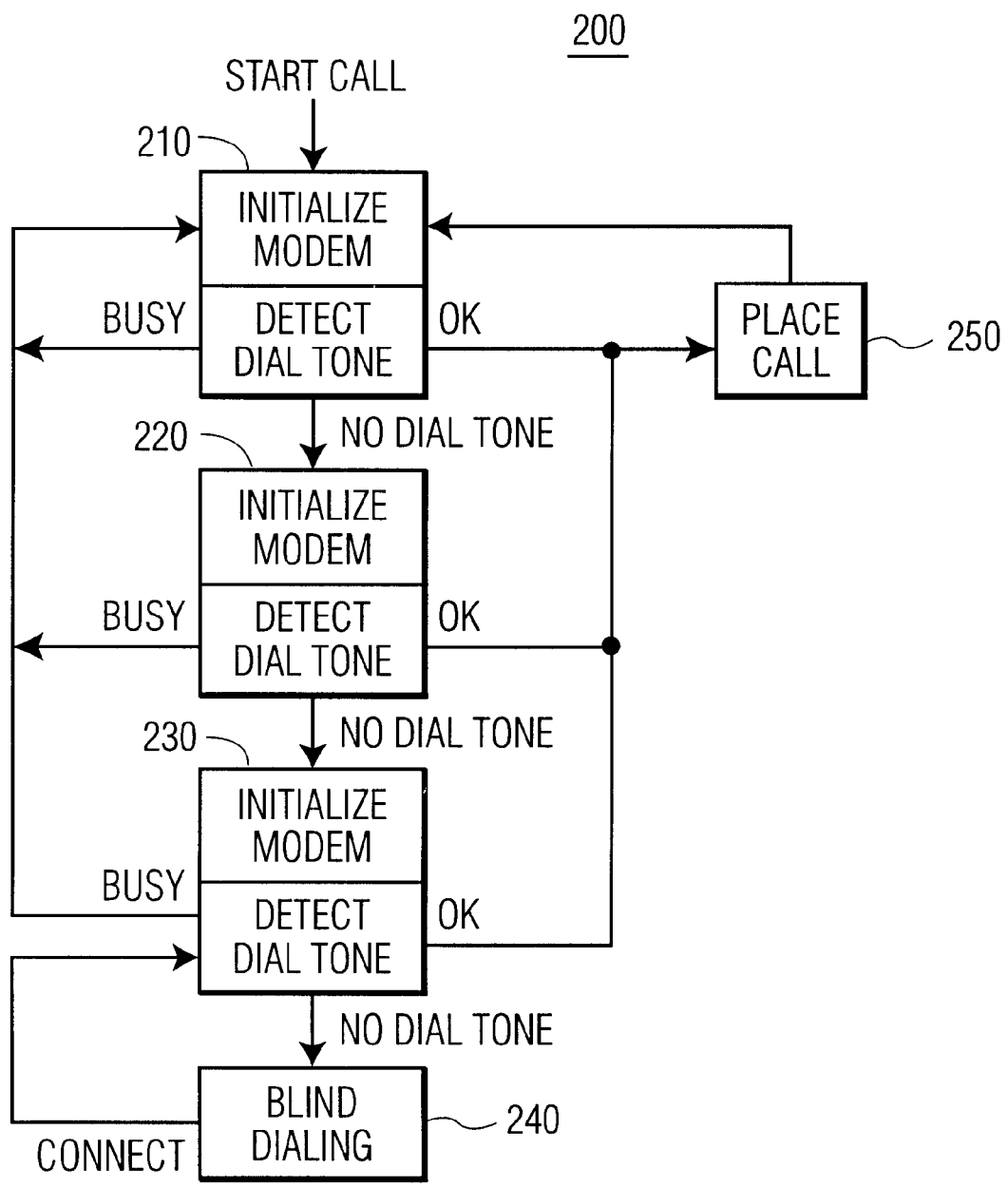
FIG. 3 is a flow diagram illustrating the operation of the telephone line access portion of the block diagram illustrated in FIG. 2.

FIG. 3 is a flow diagram illustrating the operation of the telephone line access portion of the block diagram illustrated in FIG. 2. When block 200 (of FIG. 2) is entered, indicating the start of a callback modem call, step 210 is entered. In block 210, first the modem 50 (of FIG. 1) is initialized in response to control signals supplied by the control circuit 60. In a preferred embodiment, this initialization includes: (1) setting the modem 50 to dial whether or not a dial tone is detected, and to detect a busy signal (code X3 in the Hayes Corporation command set); (2) setting the time to wait for a carrier after dialing to 30 seconds (code S07–30); (3) setting the time to wait before blind dialing to two seconds (code S06=2).

After the modem 50 is initialized as described above, the telephone connection is tested to detect a dial tone. In a preferred embodiment, this is done by initiating a dialing sequence and waiting for a dial tone, but not performing the dialing itself (code ATDTW;). The modem 50 generates one of three responses: a dial tone has been detected (response OK in the Hayes Corporation response set); a busy signal has been detected (response BUSY); or no dial tone has been detected (response NO DIAL TONE). If a dial tone is detected response OK), the callback may be made by entering block 250, to be described in more detail below. If a busy signal is detected, then the call is attempted at a later time by reentering block 210.

If no dial tone is detected, then block 220 is entered. The processing in block 220 is identical to that in block 210. That is the modem is reinitialized, and the phone line tested to detect a dial tone. As with block 210, if a dial tone is detected (response OK), the callback may be made by entering block 250. If a busy signal is detected, then the call is attempted at a later time by reentering block 210. If no dial tone is detected in block 220, block 230 is entered.

The processing in block 230 is nearly identical to that in block 220. That is the modem is reinitialized, and the phone line tested to detect a dial tone. As with blocks 210 and 220, if a dial tone is detected (response OK), the callback may be made by entering block 250. If a busy signal is detected, then the call is attempted at a later time by reentering clock 210. If, however, no dial tone is detected in block 230, then it is assumed that the dial tone is sufficiently non-standard that the modem 50 cannot accurately detect it's presence. In this case block 240 is entered in which the number will be dialed without waiting for a dial tone to be detected, in a manner to be described in more detail below.

Figure 4:
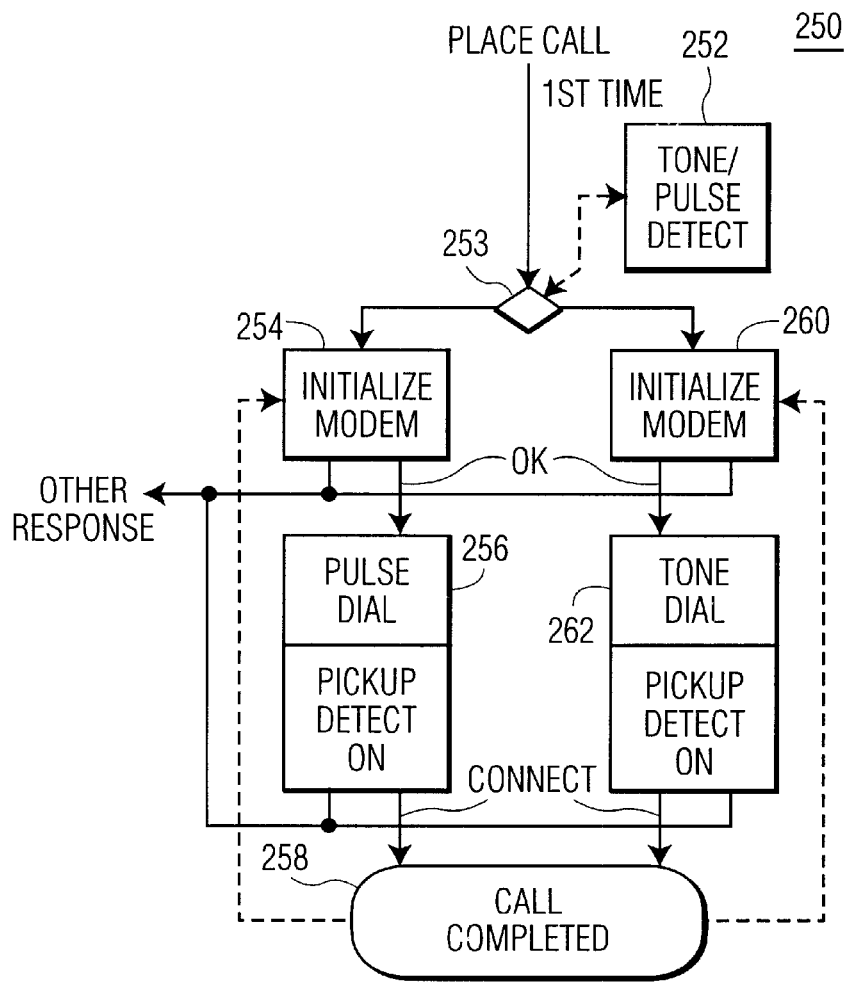
FIG. 4 is a block diagram illustrating the operation of the dialing portion of the block diagram illustrated in FIG. 3.

FIG. 4 is a block diagram illustrating the operation of the dialing portion 250 of the block diagram illustrated in FIG. 3. In FIG. 4, when a dial tone has been detected by any of the blocks 210, 220 or 230 of FIG. 3, the call is dialed in block 250. The first time block 250 is entered upon power up, or upon a reset, block 252 is entered, in which the type of dialing, either tone or pulse, acceptable to the central office, is detected, as will be described in more detail below. Under control of the determination made by the tone/pulse detector block 252, if the central office accepts only pulse dialing, then the left side of FIG. 4 is performed, and if the central office accepts tone dialing, then the right side of FIG. 4 is performed, as indicated by the small decision block 253 and dashed line from tone/pulse detector block 252 to the decision block 253.

Referring now to pulse-dial-only central offices, when a central computer is to be dialed, the modem 50 (of FIG. 1) is initialized in block 254. In a preferred embodiment, the control circuit 60 supplies commands to the modem 50 conditioning it to not wait for dial tone before dialing, but to recognize a busy signal (command X3); sets the time to wait before blind dialing to 2 seconds (command S06=2); and sets the time to wait for a carrier after dialing to 30 seconds (command S07=30). The modem 50 then connects to the telephone line for pulse dialing and waits for a dial tone, but doesn't dial the number (command ATDWP;). If the modem receives a dial tone, the modem will issue a response to indicate this (response OK). Any other response from the modem 50 results in a return to block 210 (of FIG. 3, where the process of making the callback is restarted.

If the modem 50 receives a dial tone in block 254, block 256 is performed. In block 256, the portion of the control circuit 60 (of FIG. 1) which detects when the subscriber picks up the telephone is disabled. Then the telephone number of the remote computer system is pulse-dialed (command DP[telephone number]). After the telephone number is dialed, the control circuit 60 reenables the pickup detector. If the modem 50 successfully connects to the remote computer after dialing, the modem 50 issues a response indicating this (response CONNECT). The call is now completed, as illustrated in block 258, and data transfer will take place. The next time block 250 is entered, there is no need to detect whether the central office is pulse-dial-only or tone dial, so block 252 will not be performed, and block 254 will be performed on entry, as indicated by the dashed line from block 258 to block 254.

Referring now to tone dial central offices, when a central computer is to be dialed, the modem 50 (of FIG. 1) is initialized in block 260. In a preferred embodiment, the control circuit 60 supplies commands to the modem 50 conditioning it to not wait for dial tone before dialing, but to recognize a busy signal (command X3); sets the time to wait before blind dialing to 2 seconds (command S06=2); and sets the time to wait for a carrier after dialing to 30 seconds (command S07=30). The modem 50 then connects to the telephone line for tone dialing and waits for a dial tone, but doesn't dial a number (command ATDWT;). If the modem 50 receives a dial tone, the modem 50 will issue a response to indicate this (response OK). Any other response from the modem 50 results in a return to block 210 (of FIG. 3) where the process of making the callback is restarted.

If the modem 50 receives a dial tone in block 260, block 262 is performed. In block 262, the portion of the control circuit 60 which detects when the subscriber picks up the telephone is disabled. Then the telephone number of the remote computer system is tone dialed (command DT[telephone number]). After the telephone number is dialed, the control circuit 60 reenables the pickup detector. If the modem 50 (of FIG. 1) successfully connects to the remote computer after dialing, the modem 50 issues a response indicating this (response CONNECT). The call is now completed, as illustrated in block 258, and data transfer will take place. The next time block 250 is entered, there is no need to detect whether the central office is pulse-dial-only or tone dial, so block 252 will not be performed, and block 260 will be performed on entry, as indicated by the dashed line from block 258 to block 260.

Figure 5:
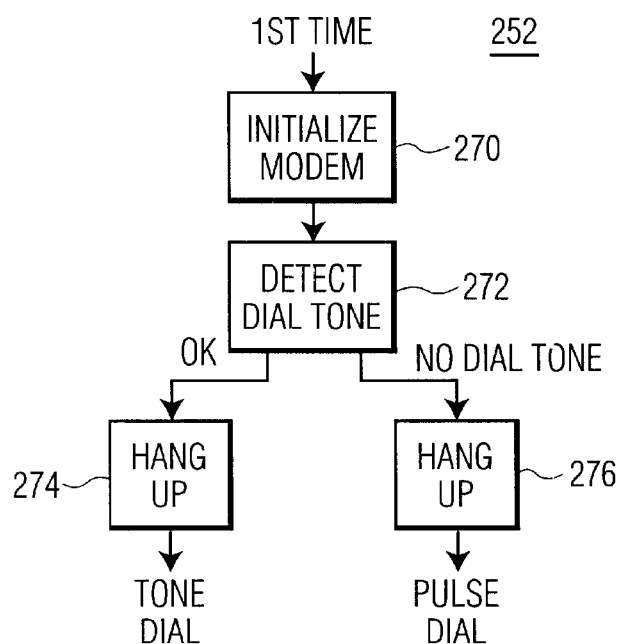
FIG. 5 is a block diagram illustrating the operation of the pulse/tone dialing detector of the block diagram illustrated in FIG. 3.

FIG. 5 is a block diagram illustrating the operation of the pulse/tone dialing detector of the block diagram illustrated in FIG. 3. The operations illustrated in FIG. 5 are performed once, the first time the callback modem dials the remote computer after initial power application, or after a reset, as described above. In block 270, the modem 50 (of FIG. 1) is initialized. In a preferred embodiment, the initialization includes beginning a tone dialing sequence dialing only a single number, e.g. "1" (command DT1;); disabling the pickup detector; and setting the time to wait for a carrier after dialing to 7 seconds (command S07=7). Then, in block 272, the modem 50 is conditioned to detect a dial tone (command DTW;). If a dial tone is detected, the modem produces a response to indicate this (response OK). In this case, the central office is a tone dial central office. The modem 50 is conditioned to hang up in block 274, and one dialing will be used. If a dial tone is not detected, the modem produces a response to indicate this (response NO DIAL TONE). In this case, the central office is a pulse-dial-only central office. The modem 50 is conditioned to hang up in block 276, and pulse dialing will be used.

Figure 6:
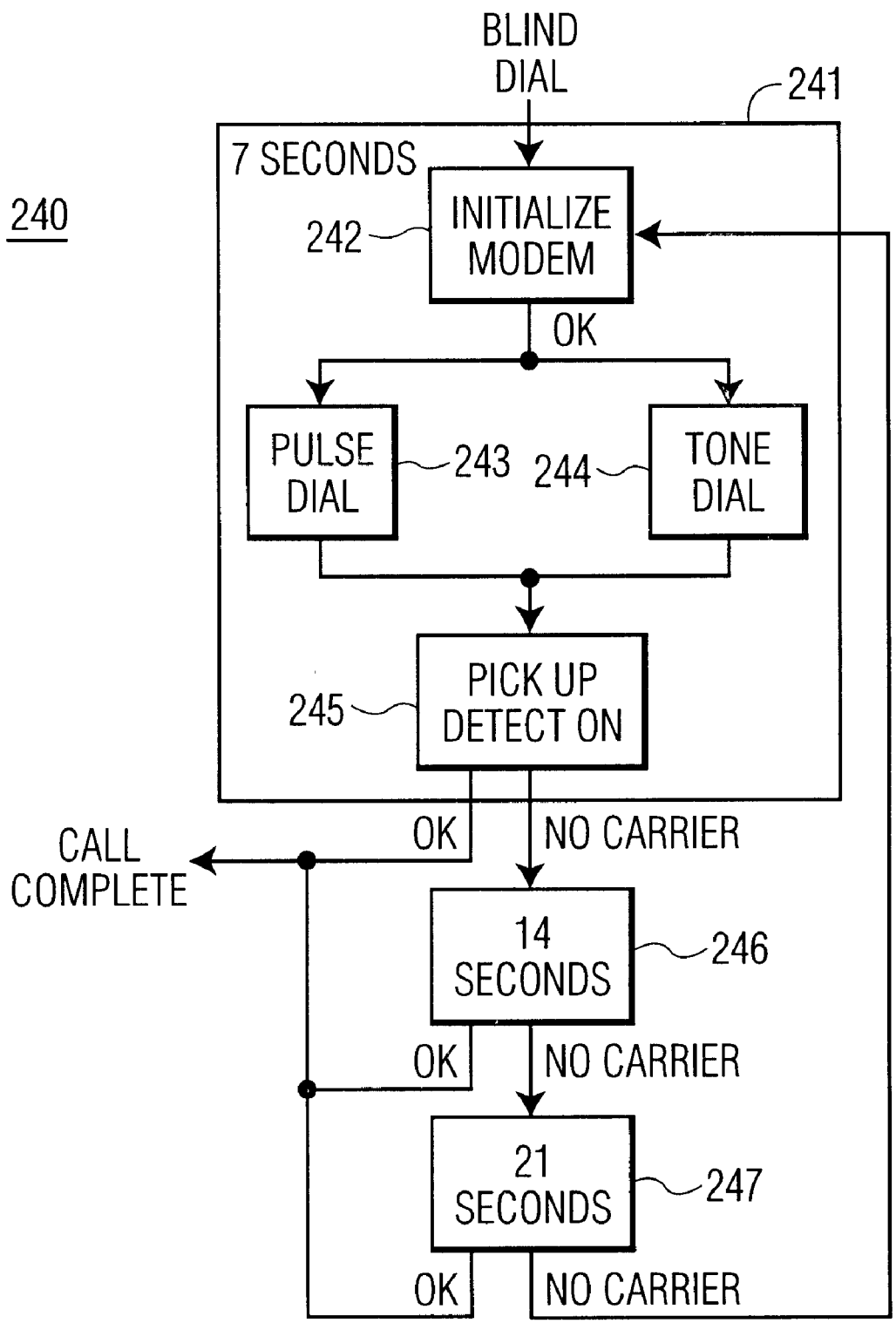
FIG. 6 is a block diagram illustrating the blind dialing operation illustrated in FIG. 3.

Referring again to FIG. 3, if a dial tone is not detected after three tries (blocks 210, 220, and 230), then it is assumed that the dial tone from the central office is non-standard in a way that makes it undetectable by the modem 50 (of FIG. 1). In this case, blind dialing is performed in block 240. FIG. 6 is a block diagram illustrating the blind dialing operation 240 illustrated in FIG. 3.

In FIG. 6, a first attempt to blind dial is made, in block 241, by waiting 7 seconds for a dial tone, then dialing, whether a dial tone is detected or not, in a manner to be described in more detail below. If that blind dialing is unsuccessful, an attempt is made by waiting 14 seconds for a dial tone in block 246, and if that attempt is unsuccessful, and attempt is made by waiting 21 seconds in block 247. If that attempt is unsuccessful, then the entire sequence is repeated. If any of the attempts successfully detect a dial tone, then the number is dialed as illustrated in block 250 of FIG. 3).

Referring specifically to block 241, in a blind dialing attempt, the modem 50 (of FIG. 1) is first initialized, as illustrated in block 242. In a preferred embodiment, the modem 50 is conditioned to: dial without waiting for a dial tone, and to recognize a busy signal (command X3); set the time to wait before blind dialing to 7 seconds (command S06=7); to wait 60 seconds for a carrier after dialing (command S07=60); and to set the pick up detector off. Then the telephone number of the remote computer is dialed either by pulse dialing in block 243 (command DP[phone number]) or by tone dialing in block 244 (command DT[phone number]). The mode of dialing is alternated. The first time through the loop of blocks 241, 246 and 247, pulse dialing is tried, the second time tone dialing, and so forth. When the telephone number has been dialed in blocks 243 or 244, the pick up detector is reenabled in block 245. If the blind dialing is successful, the remote computer will answer the call, and communications will be established and the modem 50 will generate a status signal to indicate this (response OK). If the blind dialing is unsuccessful, the modem 50 will generate a status signal to indicate this (response NO CARRIER). The status signals from the modem 50 are detected, and the appropriate next step taken, as illustrated in FIG. 6.

Referring again to FIG. 2, at all times (except during actual dialing of the telephone number of the remote computer, as described in detail above) a detector 300 monitors the subscriber telephone line to detect when the subscriber has picked up the telephone. Referring to FIG. 1, this may be detected by monitoring the current through the loop formed by the switch hook 30, the modem transformer 30 and the current detector 40. When a telephone attached to the subscriber telephone line is picked up, the loop current is shared between the telephone and the callback modem, so the current in the callback modem loop will drop. The current detector 40 supplies a signal to the control circuit representing the level of current passing through the callback modem loop. The control circuit monitors the level of this current, and if it drops in a significant manner, determines that the subscriber telephone was picked up and hangs up the callback modem by conditioning the switch hook 20 to become non-conductive. In such a case, the call to the central computer is made at a later time. If, however, the loop current is relatively low, then detecting a pickup of the subscriber telephone by detecting a drop in the current becomes unreliable. In this situation, the detection of a pick up of the subscriber telephone

TABLE I

| Loop current (ma.) | Current detect out | Trigger point |
| --- | --- | --- |
| 16 | 000 | no valid point |
| 18 | 006 | no valid point |
| 20 | 026 | 0 |
| 25 | 064 | 2 |
| 30 | 148 | drop of >50 |
| 35 | 163 | drop of >25 |
| 40 | 175 | drop of >25 |
| 45 | 184 | drop of >25 |
| 50 | 194 | drop of >20 |
| 55 | 196 | drop of >20 |
| 60 | 203 | drop of >15 |
| 65 | 204 | drop of >15 |
| 70 | 208 | drop of >15 |
| 75 | 210 | drop of >15 |
| 80 | 211 | drop of >15 |
| 85 | 215 | drop of >15 |
| 90 | 218 | drop of >15 |
| 95 | 220 | drop of >15 |
| 100 | 212 | drop of >15 |
| 105 | 222 | drop of >15 |

TABLE I-continued

| Loop current (ma.) | Current detect out | Trigger point |
| --- | --- | --- |
| 110 | 223 | drop of >15 |
| 115 | 224 | drop of >15 |
| 120 | 226 | drop of >15 | is suspended. However, the pickup detector continues to monitor the level of the loop current.

Figure 7:
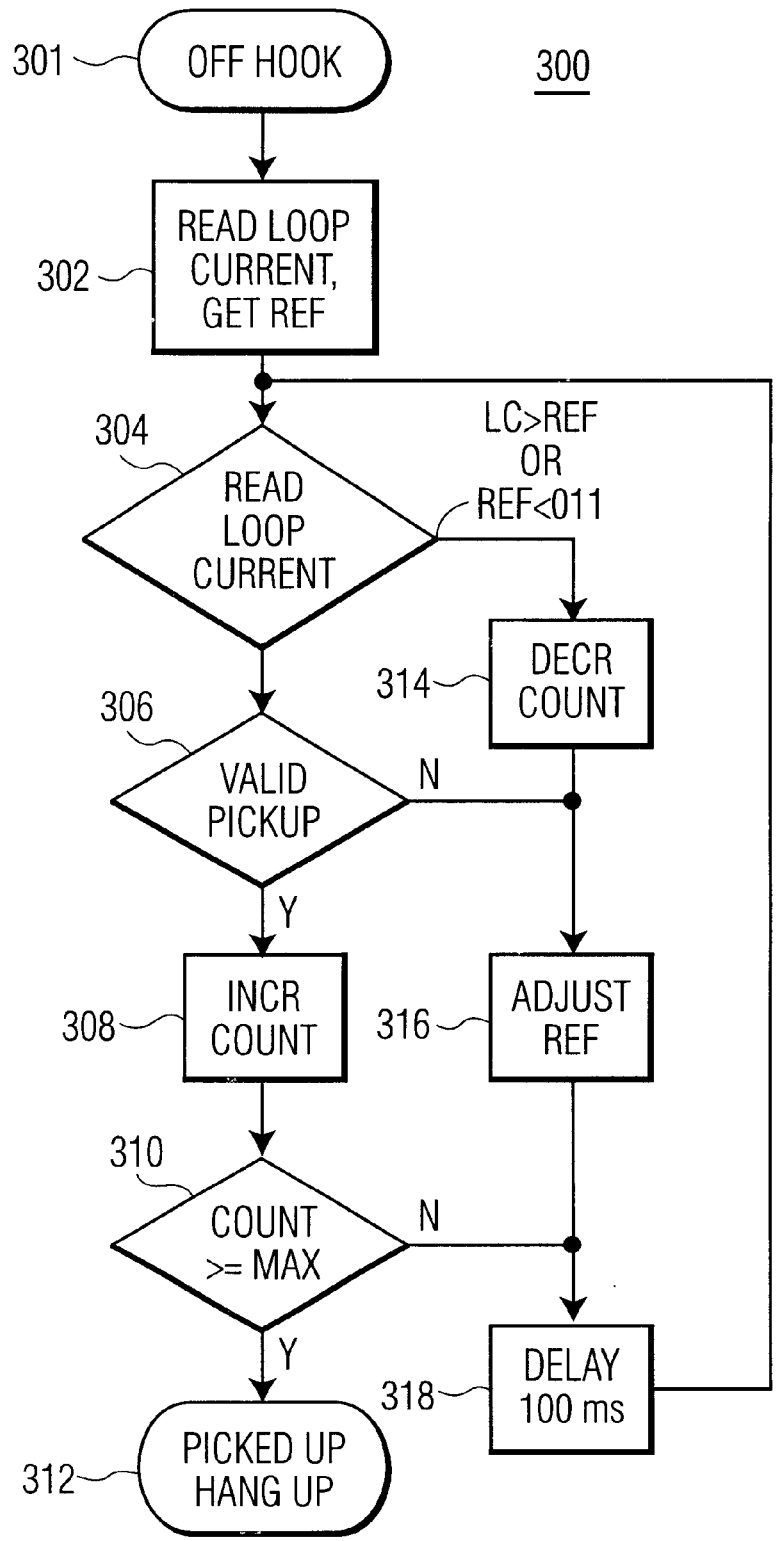
FIG. 7 is a block diagram illustrating the operation of the pickup detector illustrated in FIG. 2.

FIG. 7 is a block diagram illustrating the operation of the pickup detector 300 illustrated in FIG. 2. In FIG. 7, when the callback modem goes off hook, the pick up detector 300 begins operation in block 301. (Its operation is suspended during dialing, as described above.) In block 302, the control circuit 60 conditions the current detector 40 (of FIG. 1) to supply a signal representing the level of current currently flowing through the loop formed by the switchhook 20, modem transformer 30 and current detector 40. Table I illustrates the output values from a preferred embodiment of current detector 40.

When the line current is read in block 302, a reference loop current level is established. Then the pick up detector loop is entered in block 304. In block 304, the loop current is read again. If the loop current value read in block 304 is greater than the reference level, or the reference level is too low for accurate pick up detection (less than 011 in the preferred embodiment, then block 314 is entered. If, however, the loop current value read in block 304 is less than the reference value and the reference value is high enough for accurate pick up detection, this might indicate that the subscriber has picked up the telephone. In this case block 306 is entered. In block 306, the loop current read in block 304 and the reference value are evaluated to determine if they accurately represent the pickup of a subscriber telephone.

Referring again to Table I, each value of loop current has a criteria which indicates a valid pick up indication in block 306. Specifically, if the reference level is less than 011, then there can be no valid pick up indication (described above). If the reference level is less than 020, then a valid pick up is indicated if the loop current read in block 304 is 000. If the reference level is less than 060, a valid pickup is indicated if the loop current is less than or equal to 002. If the reference level is less than 100 then a valid pickup is indicated if the loop current is less than or equal to 010. If the reference level is less than 160, a valid pickup is indicated if the loop current drops by greater than 050. If the reference level is less than 180, a valid pickup is indicated if the loop current drops by greater than 025. If the reference level is less than 200, a valid pickup is indicated if the loop current drops by greater than 20. And, if the reference level is less than 256, a valid pickup is indicated if the loop current drops by greater than 15.

If a valid pick up is indicated, then a count of valid pick up indications is incremented in block 308. The count is evaluated in block 310. If the count is greater than a predetermined maximum count, then it is assumed that the subscriber telephone has been picked up, and the call back modem hangs up in block 312. In a preferred embodiment, the predetermined maximum value is 7. In this case, the call back is repeated at a later time. If the count has not reached the maximum count, then block, then block 318 is entered.

Referring again to block 304, if the loop current value read in block 304 is greater than the reference level, or the reference level is too low for accurate pick up detection (less than 011 in the preferred embodiment, then block 314 is entered. In block 314, the valid pick up indication count is decremented until it reaches zero, then block 316 is entered. Referring again, to block 306, block 316 is also entered, if no valid pickup indication is received. In block 316, the reference level is adjusted to generally follow slow variations in the loop current. In a preferred embodiment, an eight sample running average is maintained, as illustrated in equation (1). After the reference value is adjusted in block 316, block 318 is entered. Referring again to block 310, block 318 is also entered if the valid pick up indication count is less than the predetermined maximum count. In block 318, the loop waits until it is time to take another loop current reading in block 304. In a preferred embodiment, the delay is approximately 100 milliseconds (ms), and more specifically 110 ms. At the end of the delay time, another loop current reading is taken in block 304, and the process described above repeats.

$$REF_{new} = \frac{REF_{old} \times 7 + LOOP\ CURRENT}{8} \quad (1)$$

The quality of the telephone transmission lines between the callback modem and the remote computer can vary to such an extent that a means is necessary to adjust the signal power sufficiently to establish reliable data communications. Referring to FIG. 1, the controllable transmit attenuator 80 is conditioned to reduce signals from the modem 50 to the modem transformer 30 by −14 dB, by −10 dB, by −6 dB, or to pass them unchanged (i.e. 0 dB) in response to a control signal from the control circuit 60. In addition, it is known that a lower baud rate will be able to reliably transmit data in the presence of noise which would prevent reliable transmission at a higher baud rate. In the present Invention, both the amplification factor and the baud rate are varied in an attempt to establish reliable data communication.

Figure 8:
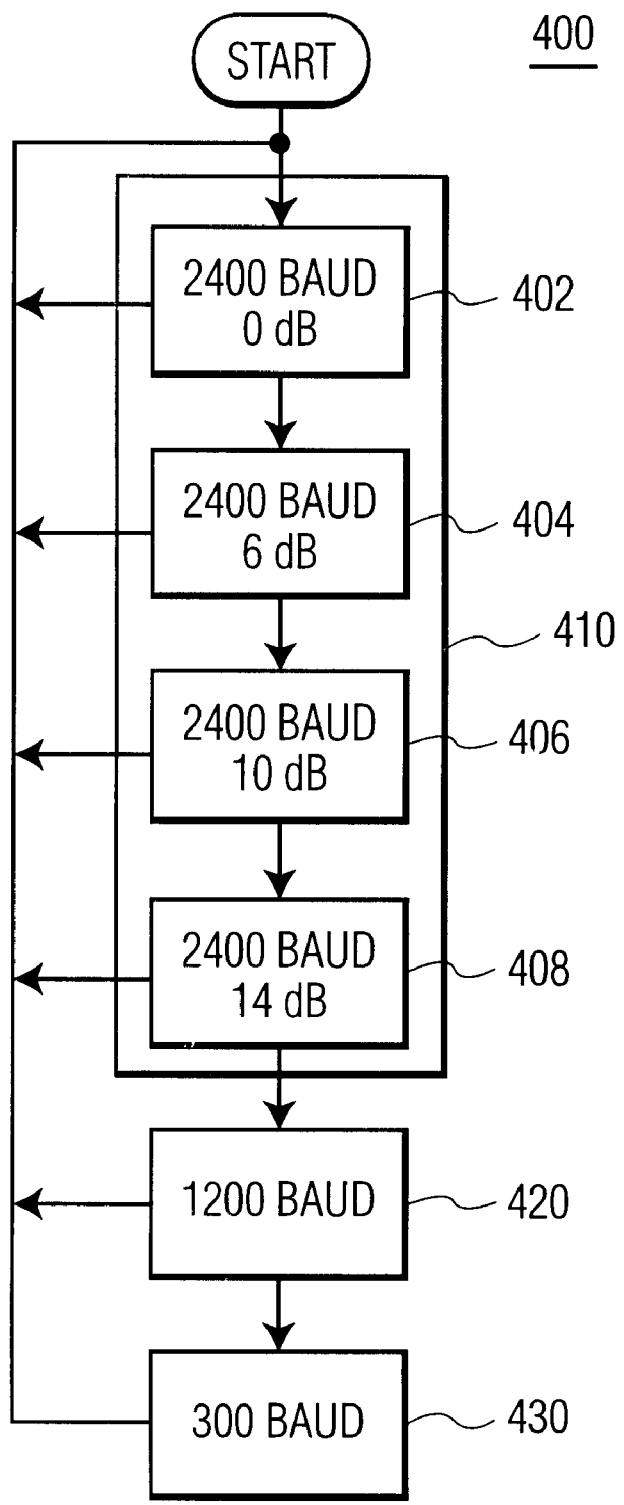
FIG. 8 is a block diagram illustrating the operation of the data connection verification process illustrated in FIG. 2.
Figure 9A:
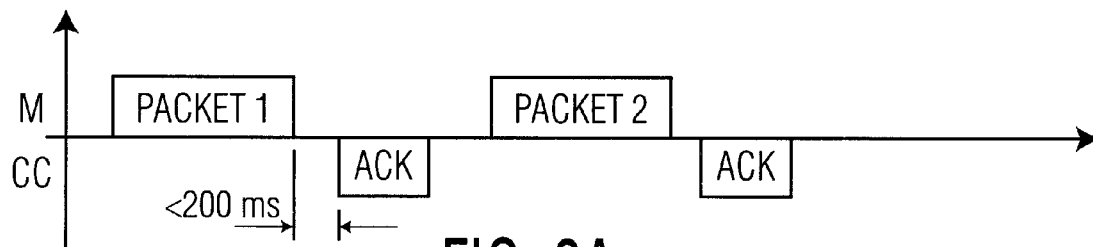
FIG. 9 is a time line diagram illustrating the transfer of data between the callback modem and the central computer.
Figure 9B:
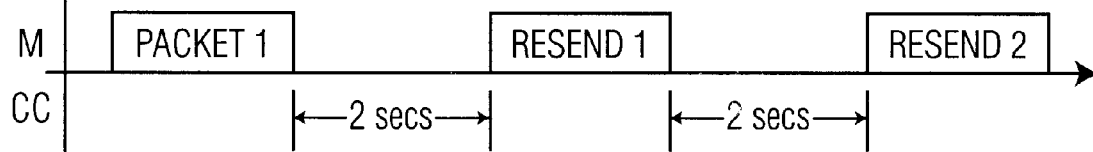
Figure 9C:
Figure 9D:
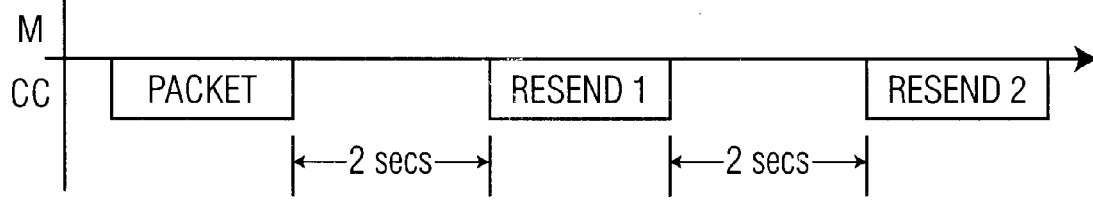

FIG. 8 is a block diagram illustrating the operation of the data connection verification process 400 illustrated in FIG. 2. Once the callback modem has connected to the remote computer, reliable data communications is established as illustrated in FIG. 8. First, an attempt is made to establish communications at the highest available data rate. In the illustrated embodiment, this data rate is 2400 baud. One skilled in the art will understand that faster modems (e.g. 9600 baud or 14,400 baud) may also be used in the present invention. In FIG. 8, an attempt is made to establish communications at 2400 baud in block 410. In block 402, the baud rate of the modem 50 (of FIG. 1) is set to 2400 baud, and the transmit attenuator 80 is conditioned to produce an output signal at an attenuation factor of 0 dB (i.e. no attenuation). An attempt is then made to log into the central computer by transmitting a log-in request. If the login attempt is successful, an acknowledgment will be received from the central computer, and the remainder of the data transfer will take place with these parameters.

If the login attempt is unsuccessful, then block 404 is entered, and the attenuation factor of the transmit attenuator 80 is set to −6 dB, and another log in attempt is made. Again, if successful, the data transfer continues using those parameters, otherwise block 406 is entered. In block 406, the attenuation factor is set to −10 dB and a log in attempt made, and if that is unsuccessful, block 408 is entered in which the attenuation factor is set to −14 dB.

If none of the login attempts are successful at 2400 baud, then block 420 is entered in which the baud rate is set to 1200 baud, and four more attempts, at the same four respective attenuation factors illustrated in block 410, are made at 1200 baud. If none of these are successful, then block 430 is entered in which the baud rate is set to 300 baud. Four more attempts, at the same four respective attenuation factors illustrated in block 410, are made at 300 baud. If none of those are successful, then it is assumed that a singularly noisy telephone connection has been made, and the call is placed again in an attempt to connect via a less noisy telephone connection.

Once the data connection has been made, then the data is transferred from the receiver 70 (of FIG. 1) to the central computer. In the preferred embodiment, the amount of data transferred from the callback modem to the central computer is relatively small, from around 400 bytes to 1,500 bytes. This data is partitioned as one, or possibly two packets. One skilled in the art will understand that more packets may be formed and transmitted if more data is required to be transferred. These packets are transferred from the callback modem to the central computer. Responses from the central computer to the callback modem are similarly made by partitioning the return data into packets. Each of the packets includes some form of error detection code, e.g. a cyclic redundancy code (CRC).

FIG. 9 is a time line diagram illustrating the transfer of data between the callback modem and the central computer. This data transfer includes data verification and packet control, as illustrated in block 500 (of FIG. 2). In FIG. 9 data is represented by rectangles. Data transmitted from the callback modem to the central computer is represented by rectangles above the time line, labeled "M" and return data from the central computer to the callback modem is represented by rectangles below the time line, labeled "CC". The topmost time line A) represents the successful transfer of data from the callback modem to the central computer. A first packet, PACKET 1, is formed from a first portion of the callback data, and transmitted from the callback modem to the central computer. The central computer checks the CRC of the received packet. If the CRC check indicates the packet was successfully received, the central computer sends an acknowledgment packet, ACK, back to the callback modem acknowledging successful receipt of the first packet within 200 ms of receipt. When the callback modem receives the acknowledgment packet, ACK, from the central computer, it sends the next packet, PACKET 2, to the central computer, which again sends an acknowledge packet, ACK, to indicate successful receipt. The data transfer from the callback modem to the central computer is now complete, and the callback modem terminates the call.

The second time line B) in FIG. 9, represents an unsuccessful transfer from the callback modem to the central computer. As in time line A), the callback modem transmits a first packet, PACKET 1, to the central computer. The central computer, however either does not receive the packet, or the CRC indicates the packet was corrupted on transmission, or some other problem arises making the packet unusable to the central computer. In this case, the central computer does not send an acknowledgment packet to the callback modem. It is also possible that acknowledgment packet is transmitted by the central computer to the callback modem, but the check of the CRC in the callback modem indicates that the packet was corrupted. In either case, no acknowledgment packet is successfully received. The callback modem waits 2 seconds to successfully receive an acknowledgment packet from the central computer. If it does not successfully receive one within 2 seconds, it resends the first packet (RESEND 1), and again waits for an acknowledgment packet from the central computer. If the central computer successfully receives the resent packet, it sends an acknowledgment packet; and if the callback modem successfully receives the acknowledgment packet, as in time line A), the transmission proceeds as illustrated in time line A).

However, in time line B), the central computer, again does not successfully receive the data packet, and again, does not transmit an acknowledgment packet. Again, the callback modem waits 2 seconds to successfully receive an acknowledgment packet from the central computer. When none is received, the packet, RESEND 2, is resent a second time. If the central computer successfully receives the packet, it sends an acknowledgment packet; and if the callback modem successfully receives the acknowledgment packet, as in time line A), the transmission proceeds. However, in time line B), the central computer, again does not successfully receive the data packet, and again, does not transmit an acknowledgment packet. After three unsuccessful attempts to transmit a packet, it is assumed that the communication line is too noisy to complete the data transfer, and the call is abandoned, and another call is placed.

A similar protocol is followed for data transfers from he central computer to the callback modem. The data to be transmitted from the central computer to the callback modem is partitioned into packets, then a packet is transmitted from he central computer to the callback modem. The third time line C) of FIG. 9 represents the successful transfer of data from the central computer to the callback modem. The central computer transmits a packet, PACKET, to the callback modem. The callback modem receives the packet, PACKET, and checks the CRC If the CRC check indicates successful reception of the data, an acknowledgment packet, ACK, is sent back to the central computer within 200 ms of receipt of the packet. If the central computer successfully receives the acknowledgment packet, it transmits the next packet (not shown), if necessary, until all data has been transferred in this manner.

The fourth time line D) of FIG. 9 represents an unsuccessful transfer of data from the central computer to the callback modem. In time line D), a packet, PACKET, is transmitted from the central computer to the callback modem, as in time line C). That packet is not received successfully by the callback modem, for reasons described above, and the callback modem, consequently does not send an acknowledgment packet. The central computer waits for 2 seconds to receive an acknowledgment packet. When no acknowledgment packet is successfully received in 2 seconds, the packet, RESEND 1, is resent, in a similar manner to that illustrated in time line B). If no acknowledgment is received again within 2 seconds, the packet, RESEND 2, is resent again. If no acknowledgment packet is received again within 2 seconds, the connection is abandoned, and the call placed again.

It is possible for the callback modem to be connected to a telephone system that is so non-standard, or has so much noise on the connections that even the automatic connection process, described in detail above, will not successfully connect to the central computer. In such a case, the data from the satellite link to the callback modem may include other parameters which may be substituted for the default parameters included in the automatic connection process described above.

Referring again to FIG. 1, when a long enough time period has elapsed (e.g. a week) without communication from the satellite receiving system to the central computer via the callback modem, it is assumed that the parameters for the automatic callback modem are not correct for establishing the data call. In this case, a block of data, containing new parameters to be used by the automatic connection process described above, is transmitted from a central program transmitting location to this satellite receiving system through the satellite link. This block of data is embedded in one or more packets, as necessary, each of which contain a destination address specifying the specific satellite receiver which has not communicated with the central computer. These packets are processed by this receiver alone, all in a known manner.

The satellite receiving system receives these packets at the satellite antenna 72. The packets are processed by the receiver 70, which recognizes its own destination address, and operates to extract the new callback modem parameters and pass those parameters to the control circuit 60. The control circuit 60, in turn, attempts to make another telephone call to the central computer using these newly received parameters. If the telephone call is not successfully placed with these parameters, another set of parameters may be transmitted from the transmitting location to this receiving system via the satellite link. This continues until communications is established. If communications cannot be established by changing parameters, this indicates a severe problem, in which case the transmission of pay-per-view programs to this receiving system is suspended until the problem is diagnosed and corrected.

In the preferred embodiment, the parameters which may be sent via the satellite link are maintained in the receiving system in an electrically erasable and programmable read only memory (EEPROM), and may be embedded in a single packet. In the preferred embodiment, the packet transmitted from the transmitting location containing these parameters contains 11 bytes of parameters and one checksum byte. The tables below present the arrangements of the bytes within the control packet, and the assignment of the bits within each byte. Table II illustrates the arrangement of the data bytes within the data portion of the packet. The first column indicates the byte number, the second column indicates the data contained within that byte, and the last two columns indicate the default values for that byte (stored in the EEPROM of the receiving system when manufactured in the factory) in hexadecimal and decimal. Table III illustrates the assignment of bits in the first data byte in the packet. These correspond to parameters settable in standard Hayes compatible modems, and will not be described in detail here.

Table IV illustrates the assignment of bits in the second data byte of the packet. These control the enabling and disabling of different functions In the automatic connection process described in detail above. Bit 7 controls whether the data verification packet control, illustrated in FIG. 8, and described in the associated detailed description, is enabled or disabled. Bit 4 controls whether the phone-in-use detector, illustrated in FIG. 3 and described in the associated detailed description is enabled or disabled. Bit 2 controls whether dial tone detection, also illustrated in FIG. 3 is enabled or disabled. Bits 1 and 0 control whether the callback modem will dial in tone mode, in pulse mode, or will determine the proper mode locally, as illustrated in FIG. 5.

Table V illustrates the assignment of bits in the third data byte of the packet. These control the attenuation factor for the DTMF tone dialing tones, the transmit attenuation factor, and the pulse dialing characteristics. Bits 7 through 5 control the DTMF attenuation, as illustrated in Table V, and bits 4 through 2 control the transmit attenuation as illustrated in Table V, and also in FIG. 8 and described in the associated detailed description. Bits 1 through 0 control the characteristics of the pulses used in pulse dialing. The characteristics represented by the values 0 and 1 correspond to values available in Hayes compatible modems. The characteristics represented by values 2 and 3 correspond to the make/break ratios of the characteristics represented by values 0 and 1, respectively, but with doubled dialing rates of 20 pulses per second.

Byte 4 contains the delay in seconds from the end of dialing until the pickup detection is reenabled, as illustrated in FIG. 4, and described in the associated detailed description. Byte 5 contains the number of consecutive pickup indicative samples which must be received before it is assumed that the subscriber has picked up the telephone. This is illustrated in FIG. 7 and described in the associated detailed description. The remainder of the bytes in the control packet represent S register values, which are known in Hayes compatible modems, and are not described in detail here.

The callback modem described above is able to automatically dial into a central computer with no operator intervention from a wide variety of telephone systems having a wide variety of standards, and variations from such standards. Such a modem is also able to receive new dialing and connection parameters if attempts to telephone the central computer are unsuccessful. Such a modem is also able to detect when the telephone subscriber line is busy and wait until it is free, and further can detect when a subscriber picks up the telephone during a data call, and immediately end the data call.

TABLE II

Callback Parameters

| Byte # | Description | Default Value Hexadecimal | Decimal |
|---|---|---|---|
| 1 | Data format/mode (See below) | 0x37 | 55 |
| 2 | Enable flags (See below) | 0x3E | 62 |
| 3 | DTMF Atten./Transmit Atten./Make-Break Ratio (See below) | 0x00 | 0 |
| 4 | Pick-up detection delay (Delay from dialing to enabling pickup detection in seconds) | 0x0A | 10 |
| 5 | Pick-up detection samples (Number of samples {100 ms apart} to declare valid pickup) | 0x05 | 5 |
| 6 | S6 (Wait for dial tone in seconds {blind dial pause time}) | 0x02 | 2 |
| 7 | S7 (Wait time for data carrier in seconds {no answer time out}) | 0x3C | 60 |
| 8 | S8 (Pause time for comma in seconds) | 0x02 | 2 |
| 9 | S9 (Carrier detect response time in 100 ms units) | 0x06 | 6 |
| 10 | S10 (Lost carrier to hang up delay in 100 ms units) | 0x0E | 14 |
| 11 | S11 (DTMF dialing speed in milliseconds {DTMF tone on timer}) | 0x5F | 95 |

TABLE III

Data Format/Mode

| Bit # | Description |
|---|---|
| 7 | 1 = 1800 Hz guard tone enabled<br>0 = guard tone disabled |
| 6 | (Reserved) set to "0" |
| 5–4 | 3 = mark/none parity<br>2 = odd parity<br>1 = space parity<br>0 = even parity |
| 3 | 1 = BELL<br>0 = CCITT |
| 2–1 | 3 = 2400 baud<br>2 = 1200 baud<br>1 = Reserved<br>0 = 300 baud |
| 0 | (Reserved) set to "1" |

TABLE IV

Enable Flags

| Bit # | Description |
|---|---|
| 7 | 1 = Data verification packet control enabled<br>0 = Data verification packet control disabled |
| 6 | (Reserved) set to "0" |
| 5 | (Reserved) set to "1" |
| 4 | 1 = Phone-in-use detect enabled<br>0 = Phone-in-use detect disabled |
| 3 | 1 = Pickup detect enabled<br>0 = Pickup detect disabled |
| 2 | 1 = Dial tone detection enabled<br>0 = Dial tone detection disabled |
| 1–0 | 3 = Reserved<br>2 = Local capability test<br>1 = Tone dialing<br>0 = Pulse dialing |

TABLE V

DTMF Attenuation/Transmit Attenuation/Make-break ratios

| Bit # | Description |
|---|---|
| 7–5 | DTMF Attenuation in 2 dB steps, 0 to 14 dB |
| 4–2 | Transmit Attenuation in 2 dB steps, 0 to 14 dB |
| 1–0 | 3 = 33/67 @ 20 pps<br>2 = 39/61 @ 20 pps<br>1 = 33/67 @ 10 pps (UK/HK)<br>0 = 39/61 @ 10 pps (USA/Canada) |

What is claimed is:

1. A subscriber callback system comprising:

a source of callback data;

a modem coupled to a first communications link comprising a subscriber telephone line; and a control circuit, coupled between the data source and the modem, for automatically placing a call by conditioning the modem to connect to the subscriber telephone line, to call a central computer, to transfer the callback data from the data source to the central computer, and to disconnect from the subscriber telephone line; and the control circuit automatically places the call in response to a predetermined calling parameter;

the callback modem further comprises a receiver, coupled to the control circuit and coupled to a second communications link for receiving a new calling parameter via the second communications link;

the control circuit replaces the predetermined calling parameter with the new calling parameter for controlling the modem during subsequent calls to the central computer; said new calling parameter is received from the central computer via the second communications link and replaces the predetermined calling parameter in response to the subscriber callback system failing to communicate with the central computer via the first communications link in accordance with a predetermined condition.

2. The subscriber callback system of claim 1 wherein the predetermined condition comprises a predetermined time period.

3. The subscriber callback system of claim 2 wherein the second communications link comprises a television signal distribution system.

4. The subscriber callback system of claim 3 wherein the television signal distribution system comprises a satellite distribution system.

5. The subscriber callback system of claim 4 further comprising a phone-in-use detector for detecting whether the subscriber telephone line is in use at the time the control circuit attempts to automatically call the central computer; and wherein the predetermined calling parameter and the new calling parameter control enabling of the phone-in-use detector.

6. A method of providing a subscriber callback system comprising the steps of:

a) connecting a modem to a first communications link comprising a subscriber telephone line for automatically placing a first call to a central computer in accordance with a predetermined calling parameter for transferring subscriber callback data to the central computer;

b) receiving a new calling parameter via a second communications link;

c) replacing the predetermined calling parameter with the new calling parameter; and d) using the new calling parameter for controlling the modem during a second call to the central computer; said new calling parameter is received via the second communications link and replaces the predetermined calling parameter in response to the subscriber callback system failing to communicate with the central computer via the first communications link in accordance with a predetermined condition and said new parameters are transmitted from the central computer via the second communication link.

7. The method of claim 6 wherein steps (b) through (d) occur in response to failing to successfully establish communication between the modem and the central computer via the first communications link in accordance with a predetermined condition during step (a).

8. The method of claim 7 wherein the predetermined condition comprises a predetermined time period and step (a) fails to communicate with the central computer via the first communications link during the predetermined time period.

9. The method of claim 8 wherein the second communications link comprises a television signal distribution system.

10. The method of claim 9 wherein the television signal distribution system comprises a satellite distribution system.

11. The method of claim 10 wherein the step (a) of connecting the modem to the central computer via the first communications link comprises a step of detecting whether the subscriber telephone line is in use before calling the central computer, and wherein the predetermined calling parameter and the new calling parameter control enabling the detecting step.

12. A subscriber callback system comprising:

a source of callback data;

a modem coupled to a first communications link comprising a subscriber telephone line; and a control circuit, coupled between the data source and the modem, for automatically placing a call by conditioning the modem to connect to the subscriber telephone line, to call a central computer, to transfer the callback data from the data source to the central computer, and to disconnect from the subscriber telephone line; and the control circuit automatically places the call in response to a predetermined calling parameter;

the callback modem further comprises a receiver, coupled to the control circuit and coupled to a second communications link for receiving a new modem parameter via the second communications link;

the control circuit replaces the predetermined calling parameter with the new modem parameter for controlling the modem during subsequent calls to the central computer; said new modem parameter is received via the second communications link and replaces the predetermined calling parameter in response to the subscriber callback system failing to communicate with the central computer via the first communications link in accordance with a predetermined condition and said new modem parameters are transmitted from the central computer via the second communication link.

13. The system according to claim 12 wherein a destination address specifying a specific receiver is received.

14. The system according to claim 13 wherein the receiver repeats automatically placing a call upon receipt of the new parameters.

* * * * *